United States Patent [19]

O'Dowd

[11] Patent Number: 4,972,352

[45] Date of Patent: Nov. 20, 1990

[54] SEMICONDUCTORS LASERS

[75] Inventor: Ronan F. O'Dowd, Celbridge, Ireland

[73] Assignee: Shildon Limited, Ireland

[21] Appl. No.: 390,879

[22] Filed: Aug. 8, 1989

[30] Foreign Application Priority Data

Aug. 10, 1988 [IE] Ireland ................................. 2434/88
Dec. 8, 1988 [IE] Ireland ................................. 3653/88

[51] Int. Cl.$^5$ ................................................ H01S 3/19
[52] U.S. Cl. .......................................... 372/50; 372/29;
372/32; 372/97; 372/108
[58] Field of Search ...................... 372/50, 97, 108, 23,
372/18, 20, 29, 32, 26, 44

[56] References Cited

U.S. PATENT DOCUMENTS

4,669,086  5/1987  Kaede et al. ........................... 372/50
4,674,100  6/1987  Kobayashi ............................. 372/50
4,748,630  5/1988  Nagashima ............................ 372/50

Primary Examiner—William L. Sikes
Assistant Examiner—Georgia Y. Epps
Attorney, Agent, or Firm—Kenyon & Kenyon

[57] ABSTRACT

A method and circuit for generating controlled light signals from electronic data signals in a semi-conductor laser transmitter of the type having a stimulated emission cavity with at least two electrical input contacts determining corresponding separate cavity regions. Electronic data input signals are applied to each input contact to drive the associated cavity region above a stimulated emission threshold level to generate cross-coupled stimulated emission by interaction of each region with carriers of the other region or regions. The electronic data signals are varied to control optic intensity and frequency according to pre-defined characteristics of the cross-coupled stimulated emission.

14 Claims, 6 Drawing Sheets

$$n(N) = n_o + \frac{\delta n}{\delta N} N \qquad \text{I}$$

$$|A_m(L)|^2 = \frac{U_1 r_1^2 e^{g_1 L_1 + g_2 L_2} + U_2 r_1^2 r_2^2 e^{2(g_1 L_1 + g_2 L_2)}}{1 - r_1^2 r_2^2 e^{2(g_1 L_1 + g_2 L_2)}} \qquad \text{II}$$

$$|B_m(o)|^2 = \frac{U_1 r_1^2 r_2^2 e^{2(g_1 L_1 + g_2 L_2)} + U_2 r_2^2 e^{g_1 L_1 + g_1 L_2}}{1 - r_1^2 r_2^2 e^{2(g_1 L_1 + g_2 L_2)}} \qquad \text{III}$$

$$P_{1m} = h\upsilon \cdot \omega d \cdot (1 - r_1^2) \, |B_m(o)|^2 \qquad \text{IV}$$
$$P_{2m} = h\upsilon \cdot \omega d \cdot (1 - r_2^2) \, |A_m(L)|^2 \qquad \text{V}$$

$$m \cdot \frac{\lambda}{2} = n_1 L_1 + n_2 L_2 \qquad \text{VI}$$

$$\frac{J_{1,2}}{ed} = R_{sp} + \Gamma v_g \Sigma_m g_{1,2}(\lambda_m) \langle S_m \rangle_{1,2} \qquad \text{VII}$$

$$\langle S_m \rangle_{1,2} = \frac{1}{L_{1,2}} \int_{L_{1,2}} S_m(z) dz \qquad \text{VIII}$$

*Fig. 10*

SEMICONDUCTORS LASERS

BACKGROUND OF THE INVENTION

The present invention relates to semiconductor laser transmitters and in particular to those of the type comprising a cavity having at least two cavity sections and an input contact in which the cavity sections are interconnected or coupled by a stimulated emission process within the cavity.

SUMMARY OF THE INVENTION

Heretofore, it has been known that light is emitted from such a semiconductor laser transmitter according to a complicated relationship between carrier and photon concentrations of adjacent cavity sections. This relationship has not, however, been understood and consequently such laser transmitters have had few practical applications. This invention is based on an understanding of such a semiconductor laser transmitter.

According to the invention there is provided a method of generating controlled light signals emitted from a semiconductor laser transmitter of the type comprising a stimulated emission cavity having at least two cavity sections, and an input electrical contact means, the method comprising the step of controlling current input signals to the input contact means according to pre-determined characteristics of the laser transmitter to generate controlled emitted light signals.

The input signals may be controlled to maintain wavelength substantially constant while varying intensity, to maintain intensity constant while varying wavelength or alternatively to vary both wavelength and intensity in a pre-defined manner.

In one embodiment, the input electrical contact means includes a separate input contact for each cavity section and the input signals to each input contact are separate.

Ideally, each input signal includes a bias current component and a separate varying current component.

In this latter embodiment, the input signals are controlled by control of the amplitude or phase difference of the varying current component. Alternatively, the input signals are controlled by control of magnitude of the bias current components.

In a further embodiment, there are two sets of input signals, one set comprising clock signals, the other set comprising data signals synchronised with the clock signals and generating a data component in the emitted light of varying intensity, so that the data signals are time division multiplexed in the emitted light.

According to another aspect of the invention, there is provided an apparatus for generating controlled light signals comprising a semiconductor laser transmitter having a stimulated emission cavity comprising at least two cavity sections and an input electrical contact means; and a current input signal circuit for controlling the current input signals to the input electrical contact means according to predetermined characteristics of the laser transmitter to generate controlled emitted light signals Ideally, the input electrical contact means comprises a separate input contact associated with each cavity section, and the input signal circuit comprises means for supplying separate input signals to each input contact.

Preferably, the input signal circuit includes a bias current source and a separate varying current source for supplying current input signals, each having a bias current component and a varying current component.

In one embodiment, the control means of the input circuit includes means for controlling amplitude and phase of the varying current component of each input signal.

Alternatively, the control means of the input circuit includes means for controlling magnitude of the bias current components of the input signals.

In a further embodiment, the separate input signals to each input contact include a clock signal and a synchronised data signal, so that the input data signals are encoded in the emitted light in time division multiplexed form.

The invention will be more clearly understood from the following description of some preferred embodiments thereof, given by way of example only, with reference to the accompanying drawings in which:

DESCRIPTION OF THE PREFERRED EMBODIMENTS

Figure 1:
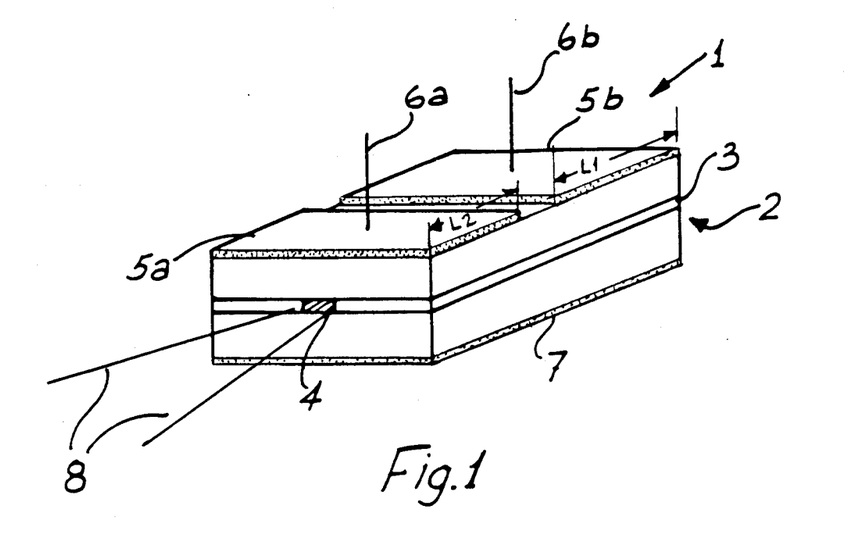
FIG. 1 is a diagrammatic perspective view from above of a semiconductor laser transmitter of the invention.

Referring to the drawings, and initially to FIG. 1, there is illustrated a conventional semiconductor laser transmitter indicated generally by the reference numeral 1. The laser transmitter 1 comprises a p-n junction diode 2 with an active layer 3, and a cavity 4 in which light stimulated emission takes place. The laser transmitter 1 also includes input contact means, namely, two drive contacts 5a and 5b having signal input conductors 6a and 6b, respectively, connected to the diode 2 at an upper side of the cavity 4. The laser transmitter 1 also includes a lower contact 7. A laser beam emitted light output from the cavity 4 is indicated by the lines 8. The semiconductor laser transmitter 1 is conventional and has been described merely to help in understanding the invention.

To assist in an understanding of the invention the following is a brief description of the manner in which I have gained an understanding of the operating characteristics of such a semiconductor laser.

Figure 2:
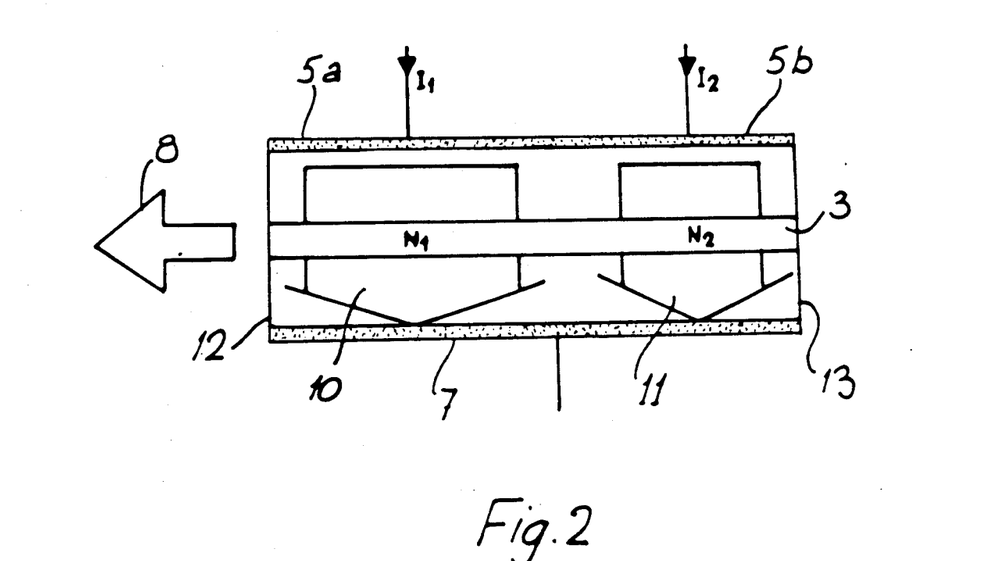
FIGS. 2 to 4 are diagrams illustrating operation of the semiconductor laser transmitter of FIG. 1.
Figure 3:
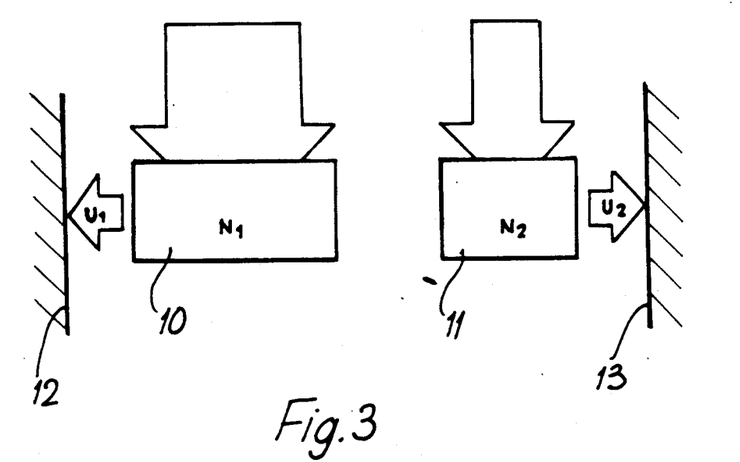
Figure 4:
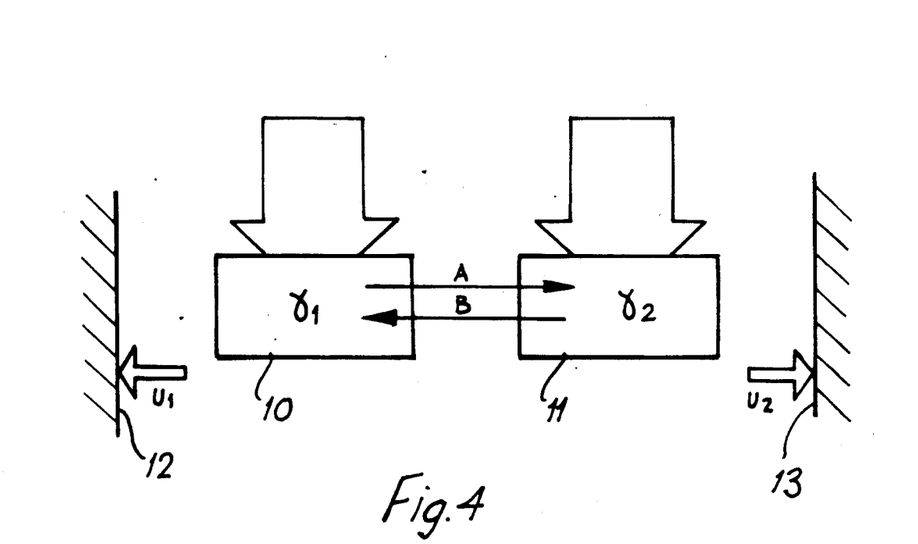

Referring now to FIGS. 2 to 4, it will be seen that in use, input signals, namely, drive current signals $I_1$ and $I_2$ are supplied to the drive contacts 5a and 5b respectively. These drive current signals vary the photon ($\gamma$) and carrier (N) concentrations of the cavity adjacent the drive contacts 5a and 5b. The separate drive contacts 5a and 5b, therefore, create two separate cavity sections 10 and 11 respectively. In these drawings, end facets of the laser transmitter 1 are indicated by the numerals 12 and 13, and the symbol "U" denotes equivalent input flux to the facets.

Figure 10:
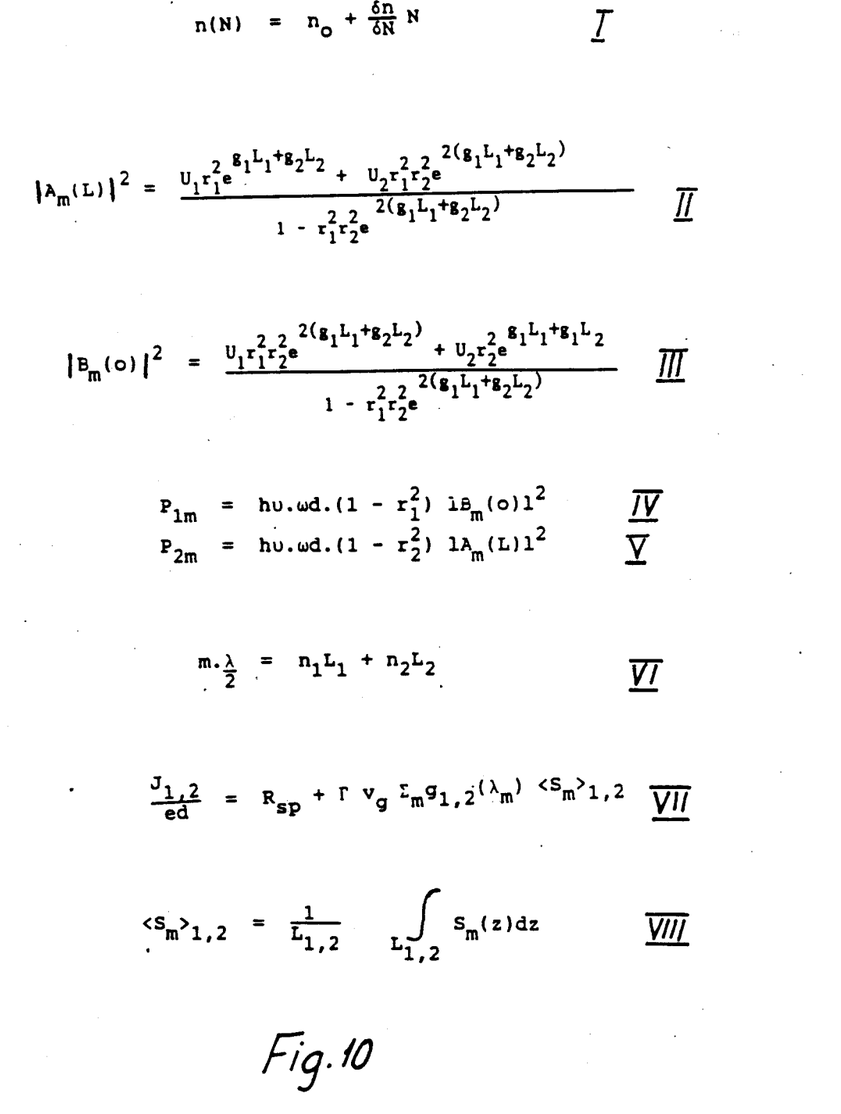
FIG. 10 is a set of mathematical expressions characterising operation of a semiconductor laser.

To model operation of the laser transmitter 1, the Fabry-Perot approach has been found to be suitable. This approach recognises the laser transmitter as a resonator containing two active amplifying cavity sections. This model also allows wavelength of emitted light to be calculated according to the relationship (I) of FIG. 10, in which N is the carrier concentration, and n is the refractive index. This model also allows for the fact that the drive current signals may be controlled independently while at the same time the carrier concentrations $N_1$ and $N_2$ are coupled by the shared photon field via the stimulated emission process. Spontaneous emission is represented by the equivalent input fluxes $U_1$ and $U_2$ to each facet. In FIG. 4, A and B represent the amplitudes of two counter-propagating photon fluxes. Using expressions for photon density as a function of the travelling fluxes and end facet boundary conditions, expressions for the amplitude of the travelling waves A and B as a function of position in the cavity 3 may be obtained. These expressions lead to an analytical expression of the mode intensities as given in expressions (II) and (III) of FIG. 10, in which the symbols represent:

r—facet reflectivity; g—model gain; L—cavity section lengths;

These expressions lead to the expressions (IV) and (V) of FIG. 10 for the output power for the $m^{th}$ mode for each facet. In these expressions, $h\nu$ and d represent photon energy and active layer thickness, respectively.

Having developed expressions for the output power, the wavelength of the output is obtained from the standard Fabry-Perot phase closure conditions, as in expression (VI) of FIG. 10.

This expression incorporates the dependence of the refractive index on the carrier density.

These expressions for power and wavelength of a given mode have been developed in terms of carrier concentrations $N_1$ and $N_2$. For this analysis to be of more benefit, it is necessary to carry out a transformation from the carrier density plane ($N_1$, $N_2$) to the current density plane ($J_2$, $J_2$) or the current magnitude plane ($I_1$, $I_2$). This is achieved by using the equation of charge conservation given in expression (VII) of FIG. 10 which provides the required link between carrier density and current density. In expression (VII) $R_{sp}$, $\Gamma$, and $V_g$, represent total spontaneous emission rate, optical confinement factor and effective group velocity.

A position independent average value for the photon density $S_m$ is used in this expression. $S_m$ is obtained by averaging the axial distribution of the photon density $S_m(z)$ over the cavity section length as in expression (VIII) of FIG. 10.

Equations (VII) and (VIII) are then used to develop expressions for the two drive current densities $J_1$ and $J_2$.

The above expressions are non linear, and accordingly, an algorithm has been developed to obtain a numerical solution in a two-step procedure involving developing loci of constant power and wavelength in the $N_1$, $N_2$ carrier density plane and carrying out a plane transformation on the $N_1$, $N_2$ plane to the $J_1$, $J_2$ current density plane.

Figure 5:
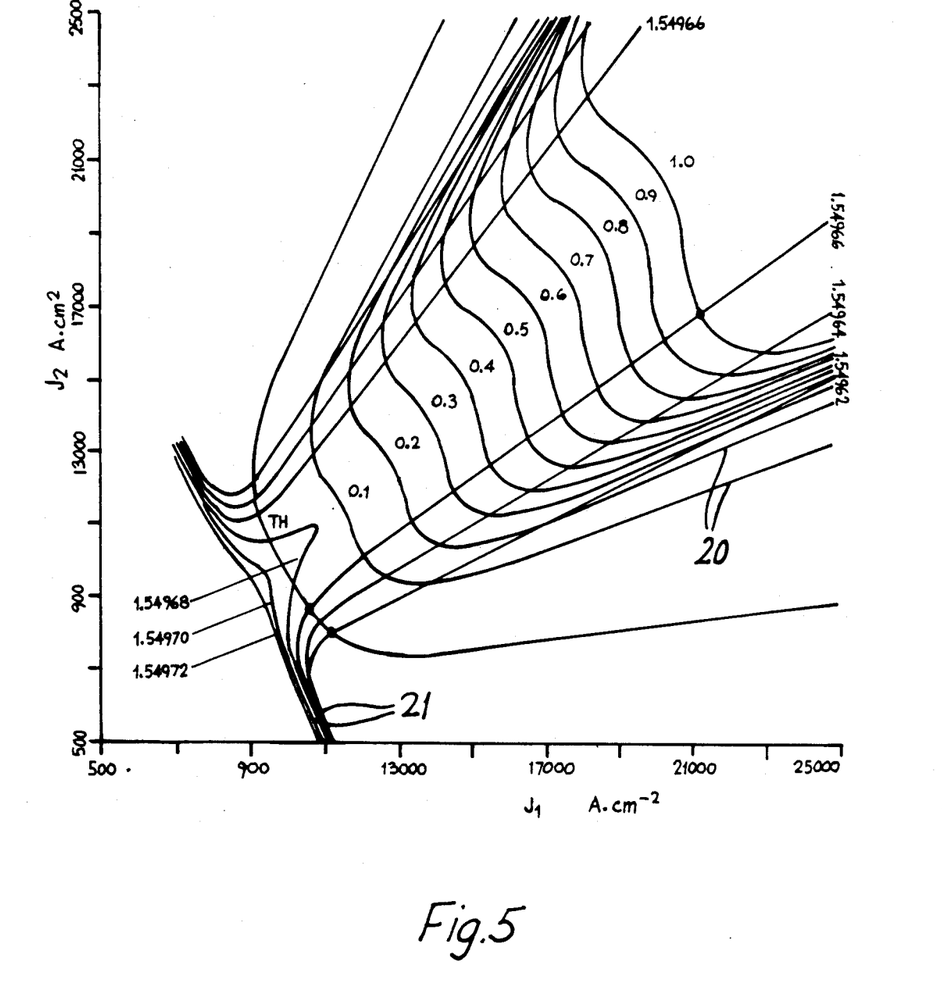
FIG. 5 is a graph illustrating operating characteristics of the laser transmitter.

Results are illustrated in FIG. 5 in which constant power contours are identified by the numeral 20 and constant wavelength contours are identified by the numeral 21. It will be appreciated that by representing these contours on the graph, the operation of the semiconductor laser transmitter 1 may be clearly seen. Needless to say, the contours illustrated vary according to temperature, facet reflectivities, chip material, structure and drive contact lengths. For any input drive condition, emitted light power and wavelength excursions may be easily determined. The results represented graphically in FIG. 5 are for the main lasing node, however, by carrying out the same procedure for the other modes various features of device operation such as side-mode suppression can be investigated.

Corresponding contours may alternatively be generated using a travelling wave analysis, instead of the Fabry-Perot analysis described above.

It has long been appreciated that there are many advantages to transmitting signals in light form instead of electrically. Consequently, much work has been carried out in attempting to improve control of light signals so that they may contain more information and in a more readable form. My invention resides in using my understanding of the operation of a semiconductor laser to provide a major improvement in control of light signals generated. The following is a description of some examples of circuits which are used to control light signals using the understanding of the operating characteristics of the semiconductor laser. These examples are not, however, exhaustive and many other applications are envisaged.

Figure 6:
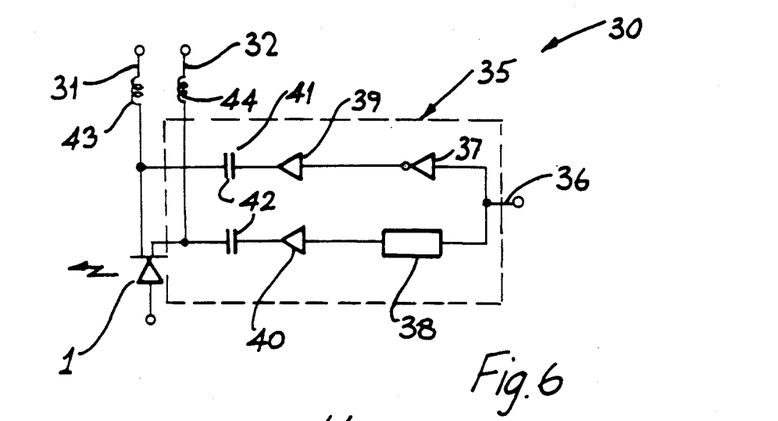
FIG. 6 is a circuit diagram of a semiconductor laser transmitter and a signal input circuit.

Referring now to FIG. 6, there is illustrated a semiconductor laser assembly 30 including the laser transmitter 1 connected to a signal input circuit. The signal input circuit comprises DC bias current sources 31 and 32 for the drive contacts 5a and 5b respectively having isolation inductors 43 and 44. The signal input circuit also includes a varying current source, in this case a alternating current circuit 35 comprising a common signal input line 36 which is connected to a inverter 37 in series connection with a drive amplifier 39 and an isolating capacitor 41 and thence to the drive contact 5a. The common input signal line 36 is also connected to the drive contact 5b via a delay circuit 38 in series connection with a drive amplifier 40 and an isolation capacitor 42.

Figure 7:
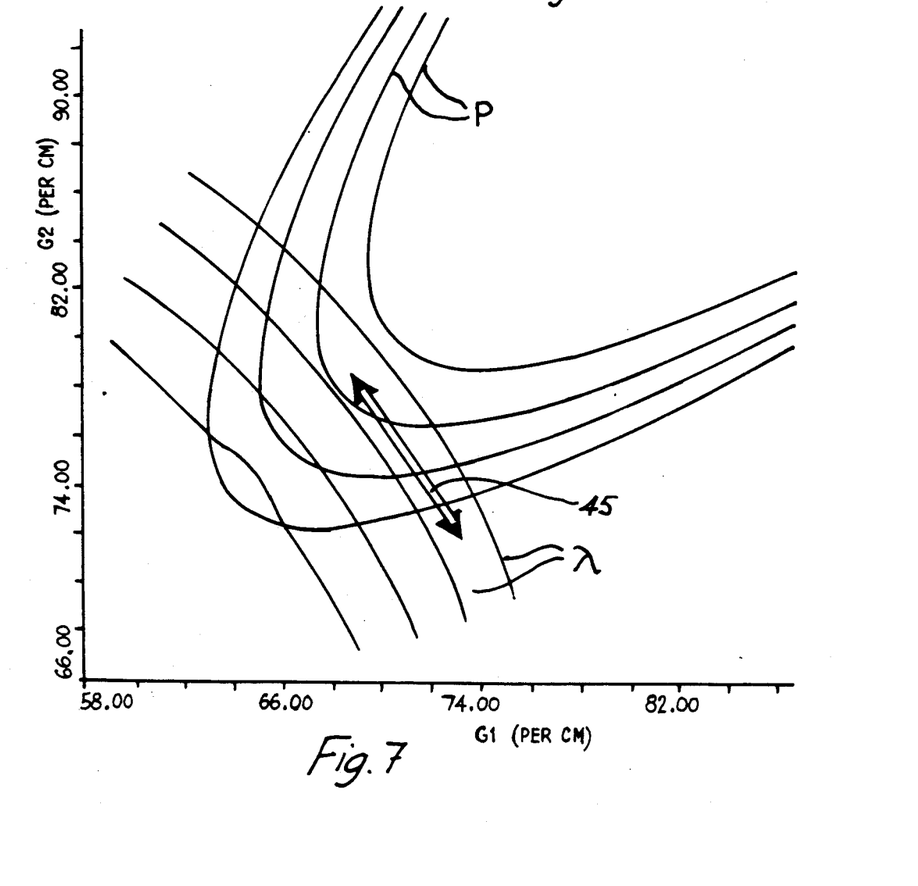
FIG. 7 is a graph illustrating operating characteristics of the transmitter of FIG. 6.

In use, the input signal circuit supplies input drive current signals to each of the drive contacts 5a and 5b. Each drive current signal comprises a constant DC bias component and an alternating current component. The value of bias current is selected according to the region in the current density or current gain plane in which the laser transmitter 1 is to be operated. The alternating current components vary the magnitude of the drive current signals for control of wavelength and power of emitted light according to any desired format so that information may be encoded in the emitted light. In this embodiment, the alternating current components vary in mutual inverse relationship because they are derived from a common input signal which is inverted before transmission to one drive contact and is delayed by an amount equal to the time delay of the inverter 37 before transmission to the other drive contact. Variations of wavelength and power of emitted light may thus be represented by the arrowed line 45 of FIG. 7. It will be seen that because the alternating current components vary inversely, the gain of one section increases as the gain of the other section decreases and vice-versa. The drive format is linear because the drive amplifiers 39 and 40 are linear in operation. Needless to say, the drive amplifiers may be modified to operate in a non-linear manner to allow the emitted light parameters to follow the contours more closely. It will be seen in this embodiment that the light output is of substantially constant wavelength and varies between different intensity levels. Accordingly, if electrical data transmitted to the common input signal line 36 is in non-return to zero and invert (NRZI) form, the encoded information in the emitted light will be in return to zero (RZ) format. The semiconductor laser 1 may thus be used as an opto-electric digital switching unit for transcoding between different code formats. It is also envisaged, for example, that the laser transmitter 1 may, in this manner, be used for conversion between pulse duration modulation and pulse position modulation formats In this case, the data address may be imposed on the laser output in the form of a time delay. If the data input on the common input signal line 36 has a bit interval of T, the output laser beam will be two short pulses of light separated by the interval T. If a receiver is permitted to accept data only after checking that this interval is correct for that particular destination, then this address forms part of the laser beam signal. It has been found, for example, that self-routing of 100M bit/second data to ten addresses can be achieved in this way.

It will also be appreciated that the laser assembly 30 may be used as an active tunable filter for optical communication receivers. By appropriate control of the drive current signals $I_1$ and $I_2$ and also by injecting received light from another laser beam through one facet, the laser transmitter acts selectively on the wavelength spectrum and can amplify wanted and/or reject unwanted wavelengths.

In this embodiment, control of the input signals has been achieved by control of the phase difference of the alternating current components. It is envisaged, however, that the bias current may be controlled, or alternatively, the amplitude of the alternating current component may be controlled.

Figure 8:
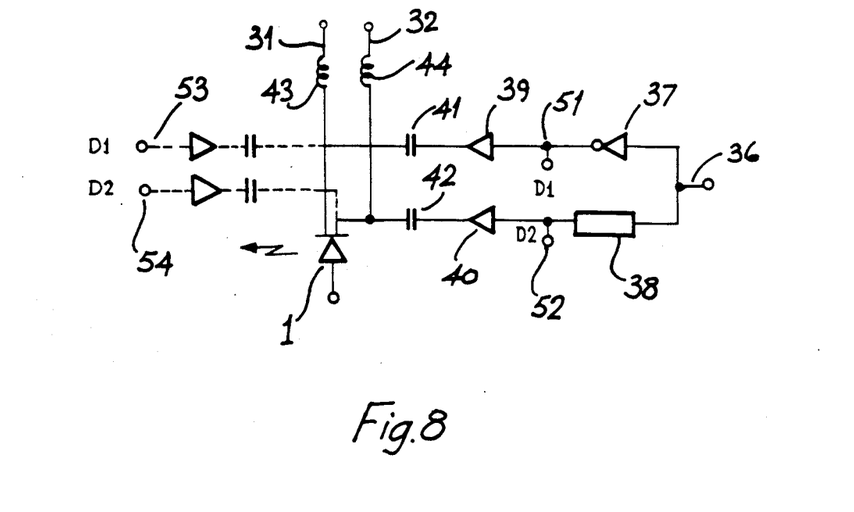
FIG. 8 is a circuit diagram of a laser transmitter and an alternative construction of signal input circuit.

Referring now to FIG. 8 there is illustrated an alternative construction of a semiconductor laser assembly according to the invention indicated generally by the reference numeral 50. Parts similar to those described with reference to FIG. 6 are identified by the same reference numerals. The laser assembly 50 is similar to the laser assembly 30 except that in this embodiment additional terminals 51 and 52 are provided at the outputs of the inverter 37 and the delay circuit 38, respectively.

Figure 9:
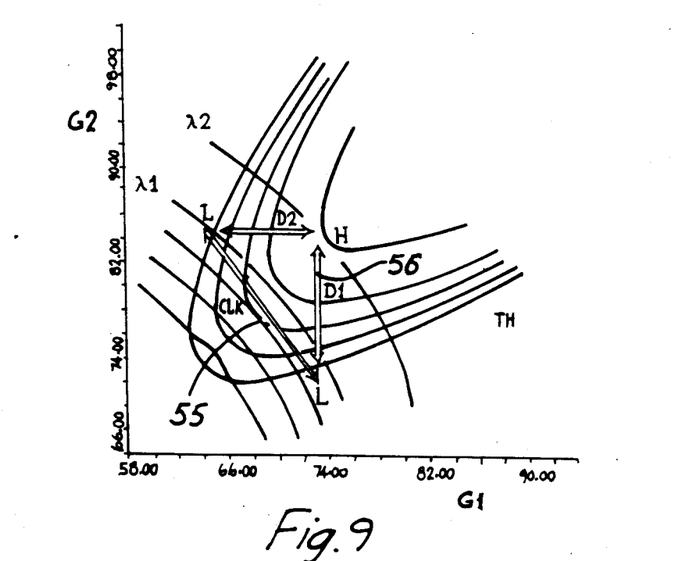
FIG. 9 is a graph illustrating operating characteristics of the laser transmitter of FIG. 8.

With this arrangement, an electrical clock signal at frequency $2f$ may be inputted on the common input signal line 36. Accordingly, the drive contacts 5a and 5b receive mutually inverted clock signals as part of the alternating current component. The drive format caused by these clock signals is illustrated by the arrowed line 55 of the graph of FIG. 9. This drive format is similar to that illustrated in FIG. 7. In addition to these clock signals, however, the alternating current components also includes data signals $D_1$ and $D_2$ which are input at the terminals 51 and 52. These data input signals $D_1$ and $D_2$ are synchronised with the clock signal input on the line 36. A data bit $D_1$, if present, drives the laser beam output across power and wavelength contours as indicated by the arrow 56 of FIG. 9. Further, a data bit $D_2$, if present, will cause an excursion as indicated by the arrow 57 of FIG. 9, but only during the next half cycle of the clock signal. This process is repeated for each following clock period, thereby generating interleaved optical data which is in time division multiplexed form. Excursions of the data streams $D_1$ and $D_2$ may be set so as to provide the required optical peak-to-peak power, or to provide appropriate wavelength switching for data encoding or destination addressing. Furthermore, a mixture of both power and wavelength switching in the appropriate device could facilitate combined wavelength and time division multiplexing to achieve 4:1 MUX. This may be achieved alternatively by adding further drive contacts to give more than two cavity sections in the laser transmitter.

In FIG. 8 there are also illustrated alternative terminals 53 and 54 for input of the data streams $D_1$ and $D_2$.

The embodiments of FIG. 6 and 8 are mere examples of the manner in which the drive current signals may be controlled to take advantage of the manner in which wavelength and intensity of emitted light may be controlled. The drive format may be arranged in any desired manner to provide for constant wavelength output or constant power output or variations in both power and wavelength. Indeed, because the relationship between output power and intensity and input current has been clearly defined, it is envisaged that the design of a laser transmitter may be modified to vary these contours to suit any particular application. It is also envisaged that the input signal circuit may include a microprocessor which stores these contours or functions for the particular laser transmitter and controls the drive current signals according to these contours and the type of light desired.

I claim:

1. A method of operating a semiconductor laser transmitter as an opto-electronic data processor for processing of electronic data signals to generate optic data signals, the semiconductor laser transmitter being of the type comprising a stimulated emission cavity having at least two separate input electrical contacts, each of which is associated with a separate region of the stimulated emission cavity, the method comprising the steps of:
    applying electronic data signals to at least two of the contacts to drive each associated cavity region above a stimulated emission threshold level thereof to generate cross-coupled stimulated emission by interaction of photons of each region with carriers of the or each other region;
    varying the electronic data signals to control optic intensity and frequency according to pre-defined characteristics representing response of optic intensity and frequency to chances in cavity region carrier concentrations when said carrier concentrations are cross-coupled by stimulated emission.

2. A method as recited in claim 1, wherein the semiconductor laser transmitter is operated as a time division multiplexer, wherein the step of applying data signals to at least two of the contacts comprises delivering data signals from a separate channel to each contact and also delivering clock signals to each contact at a rate equal to that of the data signals in each data channel multiplied by the number of contacts, said clock signals driving the transmitter between two carrier concentration states, at each of which states a substantial optic intensity excursion will occur for electronic data input at one contact only.

3. A method as recited in claim 2 wherein the semiconductor laser transmitter is operated as a combined time division and wavelength multiplexer for said data channels and an additional data channel, the step of applying data signals further comprises delivering data signals from the additional channel to a contact, and the step of varying the electronic data signals comprises varying the clock signals delivered to each contact so that the optic data signals have a different wavelength at each operating state.

4. A method as recited in claim 3, wherein two data channels are delivered to each contact for 4 to 1 multiplexing.

5. A method as recited in claim 1, wherein the semiconductor laser transmitter is operated as a pulse duration to pulse position transcoder, and the step of varying the electronic data signals comprises varying the electronic data signals to two of the contacts in a mutually inverse relationship to generate an optic intensity excursion of a complete cycle to form a pulse for each electronic data level change.

6. A method as recited in claim 5, wherein the electronic data signals are derived from a single data signal that is delivered directly to one of the two contacts and inverted before delivery to the other contact.

7. An opto-electronic data processor for processing of electronic data signals to generate optic data signals, said data processor comprising:
   a semiconductor laser transmitter comprising a stimulated emission cavity having at least two separate input electrical contacts, each of which is associated with a separate region of the stimulated emission cavity;
   means for delivering said electronic data signals to at least two of the contacts to drive each associated cavity region above a stimulated emission threshold level thereof to generate cross-coupled stimulated emission by interaction of photons of each region with carriers of the or each other region; and
   means for varying the electronic data signals to control optic intensity and frequency according to pre-defined characteristics representing response of optic intensity and frequency to changes in cavity region carrier concentrations when said carrier concentrations are cross-coupled by stimulated emission.

8. A data processor as recited in claim 7, further comprising means for operating the semiconductor laser transmitter as a time division multiplexer of data channels delivered to each contact by synchronising said data channels with clock signals also delivered to each contact at a rate double that of each data channel, said clock signals driving the transmitter between two carrier concentration states, at each of which states a substantial optic intensity excursion will occur for electronic data input at one contact only.

9. A data processor as recited in claim 8, wherein the semiconductor laser transmitter is operated as a combined time division and wavelength multiplexer for said data channels and an additional data channel delivered to a contact by varying the clock signals delivered to each contact so that the optic data signals have a different wavelength at each operating state.

10. A data processor as recited in claim 9, wherein two data channels are delivered to each contact for 4 to 1 multiplexing.

11. A data processor as recited in claim 7, wherein the semiconductor laser transmitter is operated as a pulse duration to pulse position transcoder by varying the electronic data signals to two of the contacts in a mutually inverse relationship to generate an optic intensity excursion of a complete cycle to form a pulse for each electronic data level change.

12. A data processor as recited in claim 11, wherein the electronic data signals are derived from a single data signal delivered directly to one contact and inverted before delivery to the other contact.

13. An opto-electronic data processor for processing electronic data signals to generate optic data signals, said data processor comprising:
   a semiconductor laser transmitter comprising a stimulated emission cavity having at least two separate input electrical contacts, each of which is associated with a separate region of the stimulated emission cavity;
   a common signal input line for connection to a source of electronic data signals; an inverter having an input and an output, the input of the inverter being connected to the common signal input line;
   a first drive amplifier having an input connected to the output of the inverter and an output coupled to a first one of the input electrical contacts for amplifying inverted electronic data signals from the source to a level sufficient to produce desired photon and carrier concentration in a first region of the stimulated emission cavity associated with the first contact;
   a delay circuit having an input and an output, the input of the delay circuit being connected to the common signal input line; and
   a second drive amplifier having an input connected to the output of the delay circuit and an output coupled to a second one of the input electrical contacts for
   amplifying delayed electronic data signals from the source to a level sufficient to produce desired photon and carrier concentrations in a second region of the stimulated emission cavity associated with the second contact.

14. An opto-electronic data processor for processing electronic data signals to generate optic data signals, said data processor comprising:
   a semiconductor laser transmitted comprising a stimulated emission cavity having at least two separate input electrical contacts, each of which is associated with a separate region of the stimulated emission cavity;
   a source of electrical clock signals of a predetermined rate;
   an inverter having an input and an output, the input of the inverter being connected to the source of electrical clock signals;
   a delay circuit having an input and an output, the input of the delay circuit being connected to the source of electrical clock signals;
   a first drive amplifier having an input connected to the output of the inverter and an output coupled to a first one of the input electrical contacts; and a second drive amplifier having an input connected to the output of the delay circuit and an output coupled to an output coupled to a second one of the input electrical contacts, and wherein the inputs of the first and second amplifiers are adapted to be connected to first and second sources of electronic data signals synchronized with and delivered at half the rate of the clock signals.

* * * * *